(12) United States Patent
Chen et al.

(10) Patent No.: US 10,747,099 B2
(45) Date of Patent: Aug. 18, 2020

(54) PHOTOMASK

(71) Applicant: UNITED MICROELECTRONICS CORP., Hsin-Chu (TW)

(72) Inventors: Yen-Pu Chen, Tainan (TW); Shu-Yen Liu, Tainan (TW); Tang-Chun Weng, Chiayi (TW); Tuan-Yen Yu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 315 days.

(21) Appl. No.: 15/986,799

(22) Filed: May 22, 2018

(65) Prior Publication Data

US 2019/0361339 A1 Nov. 28, 2019

(51) Int. Cl.
G03F 1/38 (2012.01)
G03F 1/54 (2012.01)
G03F 1/50 (2012.01)
H01L 21/027 (2006.01)

(52) U.S. Cl.
CPC .............. *G03F 1/38* (2013.01); *G03F 1/50* (2013.01); *G03F 1/54* (2013.01); *H01L 21/0274* (2013.01)

(58) Field of Classification Search
CPC ................ G03F 1/38; G03F 1/50; G03F 1/54
USPC ............................................................ 430/5
See application file for complete search history.

(56) References Cited

U.S. PATENT DOCUMENTS 7,816,061 B2  10/2010  Schenker
7,906,252 B2   3/2011  Lee

OTHER PUBLICATIONS

Liou, Title of Invention: Photomask, U.S. Appl. No. 15/436,764, filed Feb. 18, 2017.

*Primary Examiner* — Christopher G Young
(74) *Attorney, Agent, or Firm* — Winston Hsu

(57) ABSTRACT

The present invention provides a photomask, comprising: a substrate, a first region, a second region and a third region are defined thereon, wherein the third region is disposed between the first region and the second region, a patterned layer disposed on the substrate, wherein the patterned layer comprises a first patterned layer disposed in the first region, a second patterned layer disposed in the second region, and a third patterned layer disposed in the third region, and wherein a thickness of the first patterned layer is equal to a thickness of the second patterned layer, the thickness of the first patterned layer is different from a thickness of the third patterned layer, and at least one recess disposed in the third region.

19 Claims, 3 Drawing Sheets

PHOTOMASK

BACKGROUND OF THE INVENTION

1. Field of the Invention

The present invention relates to a photomask (or a reticle), and more particularly, to a photomask having a patterned layer with different thicknesses.

2. Description of the Prior Art

With the advancement of technology, the semiconductor processes are refined continuously. A modern chip is allowed to have a plurality of various electronic circuits configured within. The semiconductor manufacturing processes for manufacturing the chip may include many steps, such as deposition processes for forming thin films, photoresist coating processes, exposure processes, and develop processes for forming patterned photoresists, and etching processes for patterning the thin films. As the integrity of the integrated circuit increases, the dimensions of the devices in the integrated circuit become smaller. Accordingly, exposure technologies with higher resolution are steadily developed for manufacturing circuits with smaller feature dimensions. However, the exposure resolution enhancement is limited when methods, such as reducing wavelength of light source or modifying optical systems for increasing the numerical aperture (N.A.), are applied, and it is necessary to modify the design of photomask for realizing the manufacture of devices with smaller feature dimensions.

SUMMARY OF THE INVENTION

The present invention provides a photomask, comprising: a substrate, a first region, a second region and a third region are defined thereon, wherein the third region is disposed between the first region and the second region, a patterned layer disposed on the substrate, wherein the patterned layer comprises a first patterned layer disposed in the first region, a second patterned layer disposed in the second region, and a third patterned layer disposed in the third region, and wherein a thickness of the first patterned layer is equal to a thickness of the second patterned layer, the thickness of the first patterned layer is different from a thickness of the third patterned layer, and at least one recess disposed in the third region.

The present invention further provides a photomask, comprising: a substrate, a first region, a second region and a third region are defined thereon, wherein the third region is disposed between the first region and the second region, and a patterned layer disposed on the substrate, wherein the patterned layer comprises a first patterned layer disposed in the first region and a second patterned layer disposed in the second region, and wherein a thickness of the first patterned layer is equal to a thickness of the second patterned layer, and wherein a surface in the third region is a non-planar surface.

A photomask is provided in the present invention. A patterned layer with different thickness distribution and recesses are disposed in the photomask for modifying the light transmittance, the focus length or the phase shifting at regions between adjacent openings during the exposure process. The problem of unable to form the pattern corresponding to regions between adjacent openings after the exposure and the develop processes when the adjacent openings are extremely close to one another may be avoided accordingly, and the purpose of enhancing the resolution of the photolithographic process may be achieved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
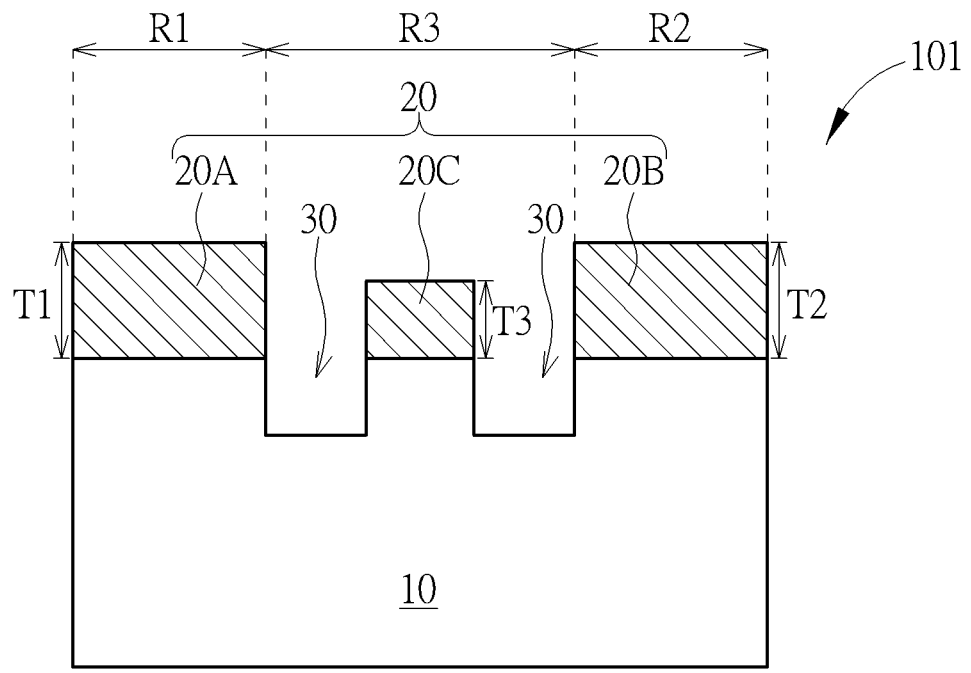
FIG. 1 is a cross section diagram illustrating a photomask according to a first embodiment of the present invention.

In conventional lithography process, when two adjacent patterns are extremely close to one another, the two patterns cannot be formed easily, especially at the gap between the two patterns. Limited by the exposure limits in the exposure process, the above two patterns are easily connected to each other, or the width of the above two patterns spaced from each other is much larger than a predetermined width. Therefore, to resolve the issue mentioned above, the present invention provides a photomask. Please refer to FIG. 1, FIG. 1 is a cross section diagram illustrating a photomask (or a reticle) according to a first embodiment of the present invention. As shown in FIG. 1, a photomask (or a reticle) 101 is provided in this embodiment. The photomask 101 includes a substrate 10, a patterned layer 20, and at least one recess 30. The substrate 10 may include a transparent substrate, such as a quartz substrate, a glass substrate, a plastic substrate, and a ceramic substrate, or substrates made of other suitable materials. The patterned layer 20 may include light-absorbing materials, light-blocking materials, or other suitable materials capable of changing the light transmittance and/or the light path of the light source used in an exposure process with the photomask 101. For example, the patterned layer 20 may include opaque materials such as chromium or resin, or translucent materials such as molybdenum silicide, but not limited thereto. Additionally, the composition ratio of materials in molybdenum silicide may be further modified for adjusting the light transmittance or being opaque. The patterned layer 20 is disposed on the substrate 10, it is noteworthy that in this embodiment, the patterned layer 20 is a single layer structure, but the present invention is not limited thereto.

In addition, a first region R1, a second region R2 and a third region R3 are defined on the substrate 10, the third region R3 is disposed between the first region R1 and the second region R2. In this embodiment, the positions of the first region R1 and the second region R2 respectively correspond to two adjacent patterns, the two patterns are extremely close to each other, but do not contact each other, and the position of the third region R3 corresponds to the space between the two patterns. When the photomask 101 and a positive photoresist are used in an exposure process and a develop process, the third region R3 of the photomask 101 may be used to form holes in the positive photoresist. Comparatively, when the photomask 101 and a negative photoresist are used in the exposure process and the develop process, the third region R3 of the photomask 101 may be corresponding to block patterns formed of the negative photoresist.

The patterned layer 20 disposed within the first region R1, the second region R2 and the third region R3, and the patterned layer 20 that disposed within the first region R1 is defined as a first patterned layer 20A, the patterned layer 20 that disposed within the second region R2 is defined as a second patterned layer 20B, and the patterned layer 20 that disposed within the third region R3 is defined as a third patterned layer 20C. In this embodiment, the first patterned layer 20A and second patterned layer 20B has a same thickness, as shown in FIG. 1, the first patterned layer 20A has a thickness T1, and the second patterned layer 20B has a thickness T2, and T1=T2. However, the present invention is not limited thereto, in other embodiments of the present invention, T1 may be different from T2, and it should also be within the scope of the present invention.

Besides, the third patterned layer 20C has thickness different from the thickness of the first patterned layer 20A and the thickness of the second patterned layer 20B. As shown in FIG. 1, the first patterned layer 20C has a thickness T3, preferably, T3 is smaller than T1 or T2. In this embodiment, the first patterned layer 20A, the second patterned layer 20B and the third patterned layer 20C have a same material, but since the third patterned layer 20C is thinner than the first patterned layer 20A and the second patterned layer 20B, so the light transmittance in the third region R3 is higher than the light transmittance in the first region R1 or the second region R2. By adjusting the thickness of the third patterned layer 20C, the light transmittance in the third region R3 can be controlled too. Therefore, when the photomask is used for the subsequent exposure process, the light transmittance of the area (e.g., the third region R3) between the two patterns can also be controlled to improve the exposure quality of the gap region, for example, to make the two patterns as close as possible to each other, but do not connected to each other.

Besides, at least one recess 30 is disposed in the substrate 10 within the third region R3, in this embodiment, one recess is disposed between the first patterned layer 20A and the third patterned layer 20C, and another recess 30 is disposed between the second patterned layer 20B and the third patterned layer 20C. The purpose of providing the recesses in the substrate 10 is to change the light wave phase shifting in the third region R3, so as to further reduce the light transmittance in the third region R3. Therefore, in addition to adjusting the thickness of the third patterned layer 20C in the third region R3 to control the light transmittance, the present invention can also control the light transmittance by providing the recesses 30.

The patterned layer 20 having the different thickness and the recesses 30 distribution in the different regions in this embodiment may be used to modify the focus length or the light transmittance at the region between two adjacent patterns in the exposure process, and the problem of unable to form the pattern corresponding to regions between adjacent patterns after the exposure and the develop processes when the adjacent patterns are extremely close to one another may be avoided accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
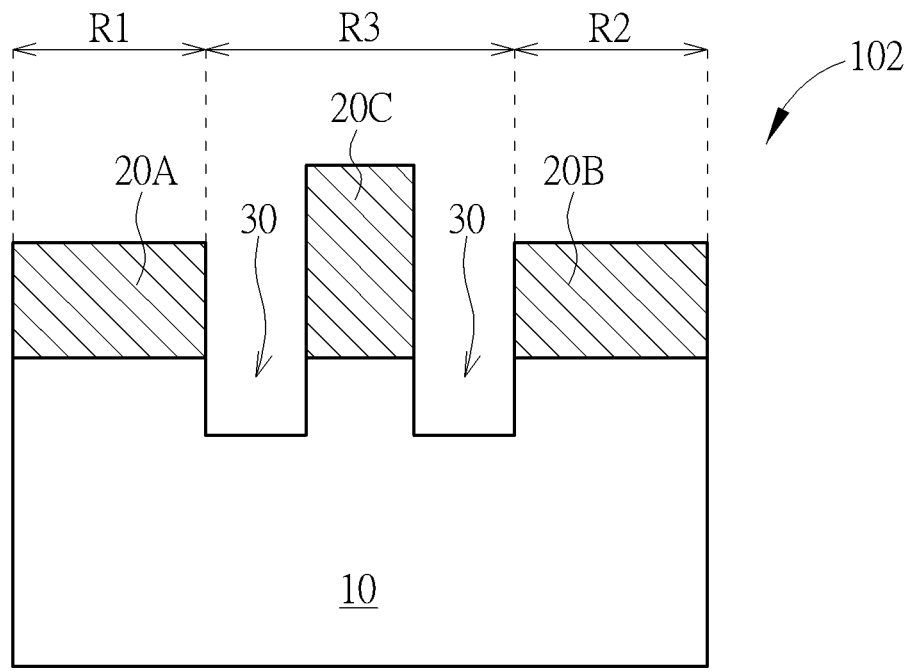
FIG. 2 is a cross section diagram illustrating a photomask according to a second embodiment of the present invention.

Please refer to FIG. 2, FIG. 2 is a cross section diagram illustrating a photomask according to a second embodiment of the present invention. In this embodiment, a photomask (or a reticle) 102 is provided, the photomask 102 is similar with the photomask 101 mentioned above, but the third patterned layer 20C within the third region R3 is thicker than the first patterned layer 20A within the first region R1 or the second patterned layer 20B within the second region R2. Except for the features mentioned above, the other components, material properties, and manufacturing method of this embodiment are similar to the first preferred embodiment detailed above and will not be redundantly described.

Figure 3:
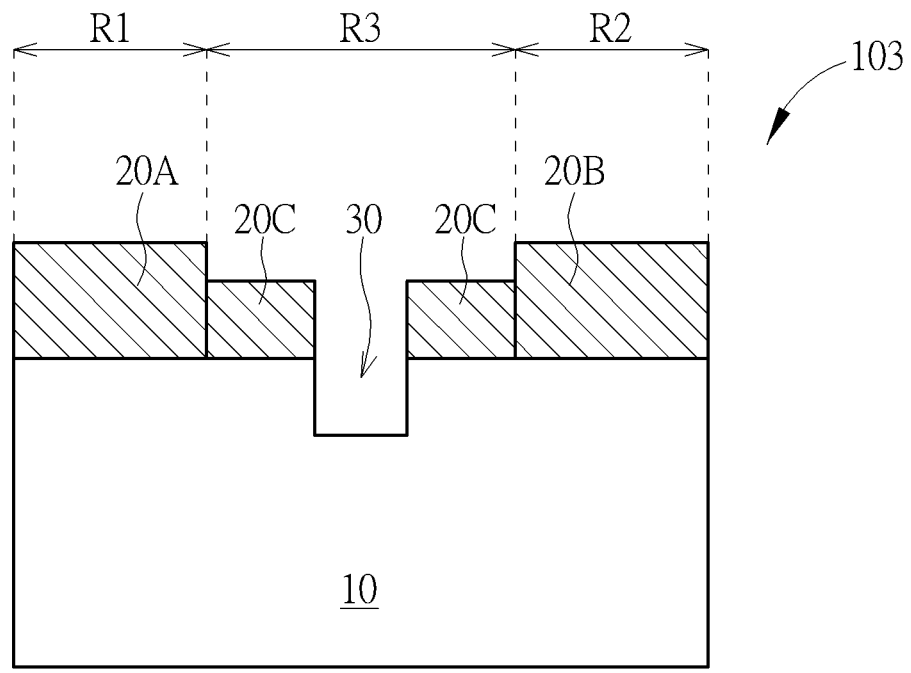
FIG. 3 is a cross section diagram illustrating a photomask according to a third embodiment of the present invention.

Please refer to FIG. 3, FIG. 3 is a cross section diagram illustrating a photomask according to a third embodiment of the present invention. In this embodiment, a photomask (or a reticle) 103 is provided, the photomask 103 is similar with the photomask 101 mentioned above, and the third patterned layer 20C within the third region R3 is thinner than the first patterned layer 20A within the first region R1 or the second patterned layer 20B within the second region R2. Besides, at least two third patterned layer 20C disposed within the third region R3, one third patterned layer 20C contacts the first patterned layer 20A directly, and another third patterned layer 20C contacts the second patterned layer 20B directly. Furthermore, in this embodiment, one recess 30 is disposed between the two third patterned layers 20C. Except for the features mentioned above, the other components, material properties, and manufacturing method of this embodiment are similar to the first preferred embodiment detailed above and will not be redundantly described.

Figure 4:
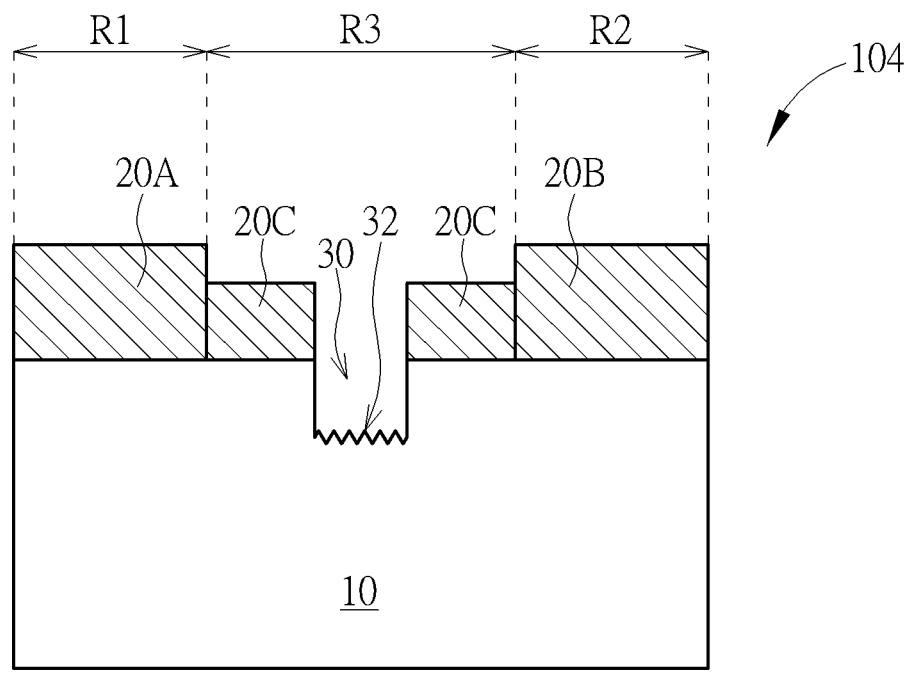
FIG. 4 is a cross section diagram illustrating a photomask according to a fourth embodiment of the present invention.

Please refer to FIG. 4, FIG. 4 is a cross section diagram illustrating a photomask according to a fourth embodiment of the present invention. In this embodiment, a photomask (or a reticle) 104 is provided, the photomask 104 is similar with the photomask 101 mentioned above, but at least two third patterned layer 20C disposed within the third region R3, one third patterned layer 20C contacts the first patterned layer 20A directly, and another third patterned layer 20C contacts the second patterned layer 20B directly. Furthermore, in this embodiment, one recess 30 is disposed between the two third patterned layer 20C, and the recess 30 has a non-planar bottom surface 32. The non-planar bottom surface can further reduce the light transmittance within the third region R3.

Figure 5:
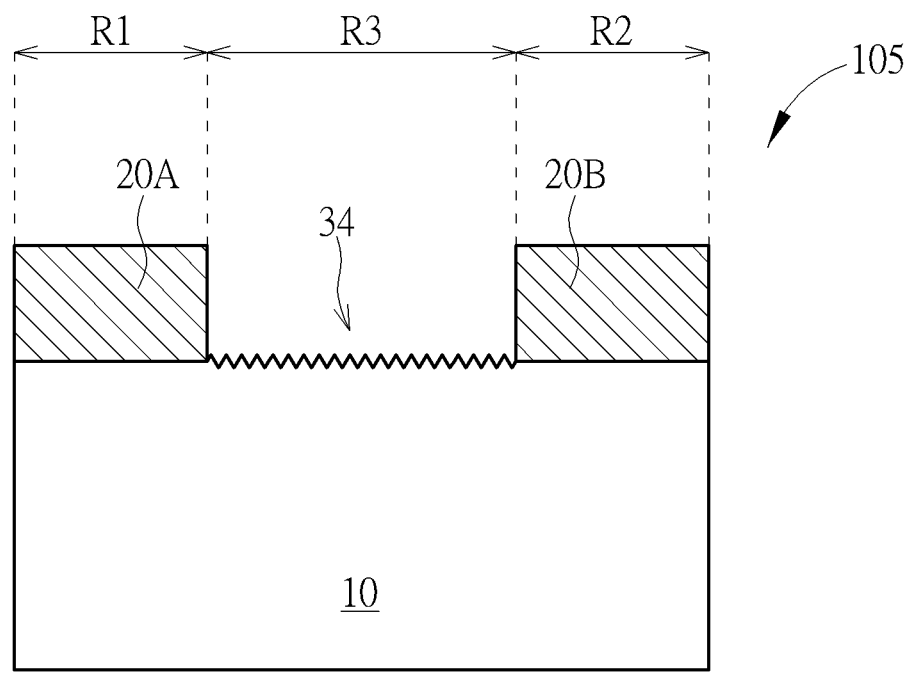
FIG. 5 is a cross section diagram illustrating a photomask according to a fifth embodiment of the present invention.

Please refer to FIG. 5, FIG. 5 is a cross section diagram illustrating a photomask according to a fifth embodiment of the present invention. In this embodiment, a photomask (or a reticle) 105 is provided, the photomask 105 is similar with the photomask 101 mentioned above, but and there is no any patterned layer disposed within the third region R3, in other words, the surface of the substrate 10 within the third region R3 is exposed. It is noteworthy that the surface of the substrate 10 within the third region R3 is a non-planar surface 34, as mentioned above, a non-planar surface can reduce the light transmittance within the third region R3. Therefore, this embodiment can also achieve the effects (decreasing the light transmittance, so as to control the exposing process at the gap region) of the first to fourth embodiments described above.

To summarize the above descriptions, in the photomask of the present invention, a photomask is provided in the present invention. A patterned layer with different thickness distribution and recesses are disposed in the photomask for modifying the light transmittance, the focus length or the phase shifting at regions between adjacent openings during the exposure process. The problem of unable to form the pattern corresponding to regions between adjacent openings after the exposure and the develop processes when the adjacent openings are extremely close to one another may be avoided accordingly, and the purpose of enhancing the resolution of the photolithographic process may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask, comprising:
   a substrate, a first region, a second region and a third region are defined thereon, wherein the third region is disposed between the first region and the second region;
   a patterned layer disposed on the substrate, wherein the patterned layer comprises a first patterned layer disposed in the first region, a second patterned layer disposed in the second region, and a third patterned layer disposed in the third region, and wherein a thickness of the first patterned layer is equal to a thickness of the second patterned layer, the thickness of the first patterned layer is different from a thickness of the third patterned layer; and
   at least one recess disposed in the substrate in the third region.

2. The photomask of claim 1, wherein a material of the first patterned layer is same as a material of the third patterned layer.

3. The photomask of claim 2, wherein the material of the first patterned layer comprises molybdenum silicide and chromium.

4. The photomask of claim 2, wherein the first patterned layer is an opaque material.

5. The photomask of claim 1, wherein parts of the substrate is covered by the third patterned layer in the third region.

6. The photomask of claim 1, wherein the substrate comprises a transparent material.

7. The photomask of claim 1, wherein the first patterned layer is a single layer structure.

8. The photomask of claim 1, wherein the third patterned layer is a single layer structure.

9. The photomask of claim 1, wherein the first patterned layer contacts the third patterned layer directly.

10. The photomask of claim 1, wherein a surface in the third region is a non-planar surface.

11. The photomask of claim 1, wherein the thickness of the third patterned layer is larger than the thickness of the first patterned layer.

12. The photomask of claim 1, wherein the thickness of the third patterned layer is smaller than the thickness of the first patterned layer.

13. A photomask, comprising:
    a substrate, a first region, a second region and a third region are defined thereon, wherein the third region is disposed between the first region and the second region; and
    a patterned layer disposed on the substrate, wherein the patterned layer comprises a first patterned layer disposed in the first region and a second patterned layer disposed in the second region, and wherein a thickness of the first patterned layer is equal to a thickness of the second patterned layer, and wherein a surface in the third region is a non-planar surface.

14. The photomask of claim 13, further comprising a recess disposed in the substrate in the third region.

15. The photomask of claim 13, wherein the third region does not comprise any patterned layer disposed therein.

16. The photomask of claim 13, wherein both the first patterned layer and the second patterned layer comprise an opaque material.

17. The photomask of claim 13, wherein both the first patterned layer and the second patterned layer are single layer structure.

18. The photomask of claim 13, wherein a material of the first patterned layer comprises molybdenum silicide and chromium.

19. The photomask of claim 13, wherein the substrate comprises a transparent material.

* * * * *